United States Patent
Watanabe et al.

(10) Patent No.: US 12,259,654 B2
(45) Date of Patent: Mar. 25, 2025

(54) METHOD FOR MANUFACTURING SEMICONDUCTOR DEVICE

(71) Applicant: SUMITOMO ELECTRIC INDUSTRIES, LTD., Osaka (JP)

(72) Inventors: Tadashi Watanabe, Yokohama (JP); Takahide Hirasaki, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/147,181

(22) Filed: Jan. 12, 2021

(65) Prior Publication Data

US 2021/0216014 A1 Jul. 15, 2021

(30) Foreign Application Priority Data

Jan. 14, 2020 (JP) .................................. 2020-003728

(51) Int. Cl.
*G03F 7/11* (2006.01)
*G03F 7/09* (2006.01)
(Continued)

(52) U.S. Cl.
CPC .............. *G03F 7/11* (2013.01); *G03F 7/094* (2013.01); *H01L 21/0274* (2013.01);
(Continued)

(58) Field of Classification Search
CPC .......... G03F 7/11; G03F 7/094; G03F 7/0236; G03F 7/095; G03F 7/004; G03F 7/405;
(Continued)

(56) References Cited

U.S. PATENT DOCUMENTS

2003/0165770 A1* 9/2003 Lee ................... G03F 7/0226
430/326
2004/0048196 A1* 3/2004 Shao ................... C08J 3/241
430/319
(Continued)

FOREIGN PATENT DOCUMENTS

JP 59124728 A * 7/1984 .......... H01L 21/306
JP 2005-107116 4/2005
(Continued)

OTHER PUBLICATIONS

Takayoshi Abe, Tooru Kimura, Takashi Chiba, Motoyuki Shima, Shiro Kusumoto, Tsutomu Shimokawa, "Contact hole shrink process with novel chemical shrink materials," Proc. SPIE 5753, Advances in Resist Technology and Processing XXII, (May 4, 2005) (Year: 2005).*

(Continued)

*Primary Examiner* — Sean M DeGuire
*Assistant Examiner* — Alexander N. Lee
(74) *Attorney, Agent, or Firm* — Smith, Gambrell & Russell LLP

(57) ABSTRACT

A method for manufacturing a semiconductor device includes steps of forming a first photoresist film on a semiconductor substrate, and forming a second photoresist film having a higher acidity than the first photoresist film on the first photoresist film, forming an opening for exposing a surface of the semiconductor substrate by patterning the first photoresist film and the second photoresist film, applying a shrink material to an upper surface of the second photoresist film and an inside of the opening, and reacting the shrink material and the second photoresist film in the inside of the opening by heat-treating the first photoresist film, the second photoresist film and the shrink material, and removing an unreacted shrink material that do not react with the second (Continued)

photoresist film from the upper surface of the second photoresist film and the inside of the opening.

14 Claims, 4 Drawing Sheets

(51) Int. Cl.
    *H01L 21/027*     (2006.01)
    *H01L 29/20*     (2006.01)
    *H01L 29/66*     (2006.01)
    *H01L 29/778*     (2006.01)

(52) U.S. Cl.
    CPC .... *H01L 29/2003* (2013.01); *H01L 29/66462* (2013.01); *H01L 29/7786* (2013.01)

(58) Field of Classification Search
    CPC ............. H01L 21/0274; H01L 21/0273; H01L 21/28575; H01L 21/0272; H01L 21/28008; H01L 29/2003; H01L 29/66462; H01L 29/7786; H01L 29/401

See application file for complete search history.

(56) References Cited

U.S. PATENT DOCUMENTS

| | | | | |
|---|---|---|---|---|
| 2004/0131963 | A1* | 7/2004 | Ohta | G03F 7/0233 430/269 |
| 2005/0069813 | A1* | 3/2005 | Sawada | G03F 7/40 430/311 |
| 2005/0255696 | A1 | 11/2005 | Makiyama | |
| 2008/0268369 | A1* | 10/2008 | Ikezaki | G03F 7/095 430/326 |
| 2010/0104768 | A1 | 4/2010 | Xiao | |
| 2017/0287694 | A1* | 10/2017 | Robello | H01L 21/0272 |
| 2018/0151349 | A1 | 5/2018 | Watanabe | |

FOREIGN PATENT DOCUMENTS

| | | |
|---|---|---|
| JP | 2008-242247 | 10/2008 |
| JP | 2009-198587 | 9/2009 |
| JP | 2015-127796 | 7/2015 |
| JP | 2018-092985 | 6/2018 |

OTHER PUBLICATIONS

CA Notice of Reasons for Refusal (issued for JP Patent Application No. 2020-003728).

Chinese Office Action relative to CN 202110019174.2, dated Jan. 21, 2025 (6 pages Chinese, 6 pages English).

* cited by examiner

METHOD FOR MANUFACTURING SEMICONDUCTOR DEVICE

CROSS-REFERENCE TO RELATED APPLICATION

This application is based upon and claims the benefit of priority of the prior Japanese Patent Application No. 2020-003728, filed on Jan. 14, 2020, the entire contents of which are incorporated herein by reference.

FIELD

The present disclosure relates to a method for manufacturing a semiconductor device, for example, a method for manufacturing a semiconductor device including a step of forming an opening in photoresist films.

BACKGROUND

In semiconductor devices using compound semiconductors such as GaN and GaAs, such as a High Electron Mobility Transistor (HEMT) and a Monolithic Microwave Integrated Circuit (MMIC), a lift-off method is used to form an electrode such as a gate electrode on a semiconductor substrate. In order to form the gate electrode having a desired shape at a desired location on the semiconductor substrate, an upper surface of the semiconductor substrate is covered with a photoresist film, an opening is provided on the photoresist film so as to expose the semiconductor substrate, and the lift-off method is performed. The gate electrode is formed according to the shape of the opening.

Lift-off is made easier by making an opening length of the lower surface of the photoresist film smaller than an opening length of the upper surface. As a method of forming such an opening, it is known that two photoresist films with different photosensitivity are formed, irradiated with light and then exposed and developed, thereby making the opening length of a lower photoresist film larger than that of an upper photoresist film (e.g. Patent Document 1: Japanese Patent Application Publication No. 2008-242247). It is known that an opening having a small opening length is formed in the photoresist film by exposing the photoresist with an electron beam (EB) (e.g. Patent Document 2: Japanese Patent Application Publication No. 2009-198587). It is known that a chemical solution that swells a photoresist film is applied to the photoresist film to form an opening having a small opening length and an inverted tapered shape (e.g. Patent Document 3: Japanese Patent Application Publication No. 2005-107116).

SUMMARY

By using the chemical solution that swells the photoresist film as in the Patent Document 3, it is possible to form the opening having the small opening length and the inverted tapered shape by using light such as i-line. However, for example, when the opening length is reduced in order to shorten a gate length of the HEMT, it is not sufficient that a cross-sectional shape of the opening is the inverted tapered shape in order to form a gate electrode by the lift-off method.

It is therefore an object of the present disclosure to form photoresist films having an opening with a shape suitable for the lift-off method.

A method for manufacturing a semiconductor device according to the present disclosure includes steps of: forming a first photoresist film on a semiconductor substrate, and forming a second photoresist film having a higher acidity than the first photoresist film on the first photoresist film; forming an opening for exposing a surface of the semiconductor substrate by patterning the first photoresist film and the second photoresist film; applying a shrink material to an upper surface of the second photoresist film and an inside of the opening, and reacting the shrink material and the second photoresist film in the inside of the opening by heat-treating the first photoresist film, the second photoresist film and the shrink material; and removing an unreacted shrink material that do not react with the second photoresist film from the upper surface of the second photoresist film and the inside of the opening.

DESCRIPTION OF EMBODIMENTS

Some embodiments will now be described.

(1) An embodiment of the present disclosure is a method for manufacturing a semiconductor device includes steps of: forming a first photoresist film on a semiconductor substrate, and forming a second photoresist film having a higher acidity than the first photoresist film on the first photoresist film; forming an opening for exposing a surface of the semiconductor substrate by patterning the first photoresist film and the second photoresist film; applying a shrink material to an upper surface of the second photoresist film and an inside of the opening, and reacting the shrink material and the second photoresist film in the inside of the opening by heat-treating the first photoresist film, the second photoresist film and the shrink material; and removing an unreacted shrink material that do not react with the second photoresist film from the upper surface of the second photoresist film and the inside of the opening. Thereby, it is possible to form the photoresist films having the opening with a shape suitable for a lift-off method.

(2) It is preferable that the shrink material includes polyvinyl alcohol, the first photoresist film and the second photoresist film include a novolac resin, the first photoresist film and the second photoresist film further include ethyl lactate, and a weight concentration of ethyl lactate in the second photoresist film is higher than that of ethyl lactate in the first photoresist film.

(3) It is preferable that the shrink material includes polyvinyl alcohol, the first photoresist film and the second photoresist film include a novolac resin, the second photoresist film further includes ethyl lactate, and the first photoresist film includes no ethyl lactate.

(4) It is preferable that an opening length in the second photoresist film reacted with the shrink material by the heat-treating is smaller than an opening length in the first photoresist film.

Specific examples of a method for manufacturing a semiconductor device according to the present disclosure will be described below with reference to the drawings. It should be noted that the present disclosure is not limited to these examples, but is indicated by claims, and it is intended to include all modifications within the meaning and range equivalent to the claims.

First Embodiment

Figure 1A:
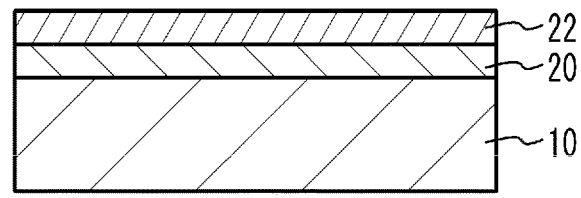
FIGS. 1A to 1E are cross-sectional views illustrating a method for forming photoresist films having an opening according to a first embodiment.

A first embodiment describes an example of a method for forming photoresist films having an opening. FIGS. 1A to 1E are cross-sectional views illustrating the method for forming the photoresist films having the opening according to the first embodiment. These cross-sectional views illustrate cross-sectional structure of the semiconductor device when the semiconductor device is cut along a film forming direction, for example. As illustrated in FIG. 1A, a semiconductor substrate 10 is prepared. The semiconductor substrate 10 is a substrate made of a semiconductor material, or a substrate which is made of an insulator or a semiconductor and has a semiconductor layer formed thereon, for example. The substrate made of the semiconductor material is a silicon substrate or a GaAs substrate, for example. The substrate which is made of the insulator or the semiconductor and has the semiconductor layer formed thereon is, for example, a substrate on which at least one of GaAs, AlGaAs and/or InGaAs layers is formed on a GaAs substrate, or a substrate on which at least one of GaN, AlN, AlGaN and/or InGaN layers is formed on a silicon substrate, a GaN substrate, a SiC substrate, or a sapphire substrate.

A photoresist film 20 is applied on the semiconductor substrate 10, and a photoresist film 22 is applied on the photoresist film 20. For example, a direction in which the respective films are formed in an order of the photoresist film 20 and the photoresist film 22 on the semiconductor substrate 10 is the film forming direction. Each of the film thicknesses of the photoresist films 20 and 22 is 0.1 μm to 1 μm, for example. Each of the photoresist films 20 and 22 mainly include a photosensitizer such as a novolac resin and a naphthoquinone azide derivative, and an organic solvent (solvent). The photoresist film 20 has a higher acidity than the photoresist film 22.

Figure 1B:
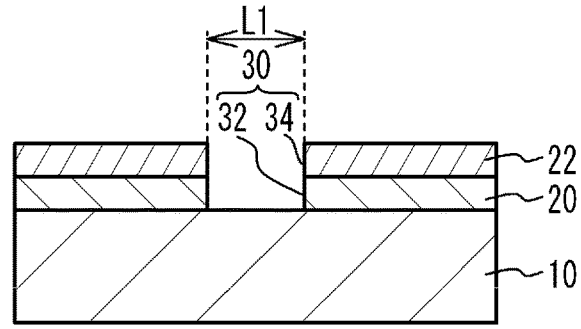

As illustrated in FIG. 1B, the photoresist films 20 and 22 are selectively irradiated with ultraviolet ray using an i-line stepper or the like. Then, by developing the photoresist films with a developing solution, openings 32 and 34 are formed in the photoresist films 20 and 22, respectively. The opening 30 includes the openings 32 and 34. Here, the opening 30 means an entire hole-shaped or groove-shaped space from an opening portion (opening) opened on an upper surface of the photoresist film 22 to an upper surface of the semiconductor substrate 10. The opening 30 has the opening 32 of the photoresist film 20 and the opening 34 of the photoresist film 22. The term "opening" refers only to a portion that is opened at the upper surface of the photoresist film 22 among the opening 30, in particular.

Opening lengths of the openings 32 and 34 are substantially the same and are L1. The opening length L1 is 0.3 μm to 1 for example. The opening length L1 is set according to a gate length of the HEMT, for example. The opening length L1 is, for example, a length of the opening 30 (i.e., the opening length of the opening 30) on the upper surface of the photoresist film 22 along a direction from a source electrode to a drain electrode when the HEMT is formed (e.g. the source electrode and the drain electrode correspond to an ohmic electrode 14 of FIGS. 3B to 3D).

Figure 1C:
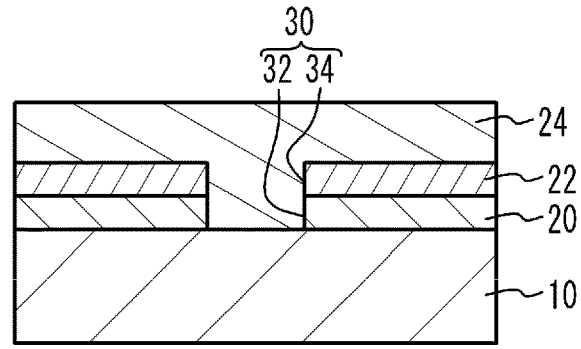

As illustrated in FIG. 1C, a shrink material 24 is applied to the upper surface of the photoresist film 22 and the inside of the opening 30. The shrink material 24 is filled in the opening 30. The shrink material 24 mainly includes polyvinyl alcohol and a solvent (an organic solvent and/or water), for example.

Figure 1D:
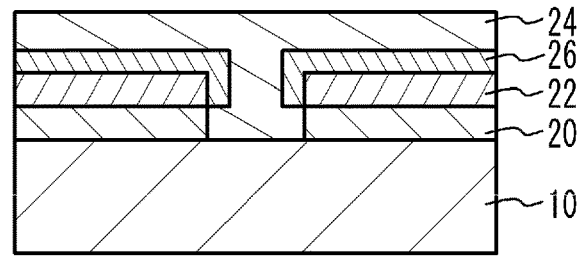

As illustrated in FIG. 1D, the semiconductor substrate 10 is heated to heat-treat (bake) the photoresist film 20, the photoresist film 22 and the shrink material 24. A heat treatment temperature is 80° to 150° C., for example. The photoresist film 22 and the shrink material 24 react with each other to form a shrink film 26. The heat treatment hardly causes the photoresist film 20 and the shrink material 24 to react with each other.

Figure 1E:
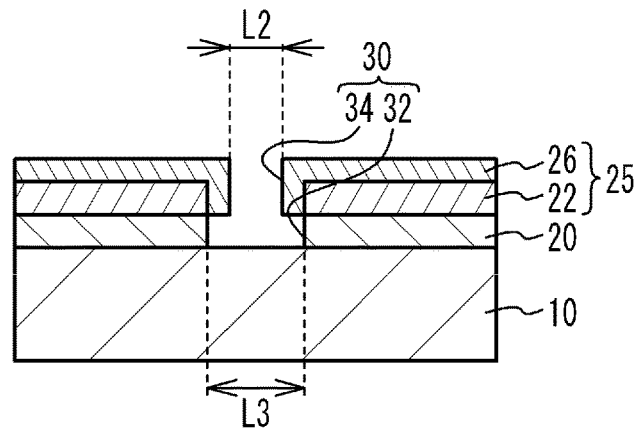

As illustrated in FIG. 1E, the shrink material 24 (i.e., an unreacted shrink material 24) remained without reacting with the photoresist films 20 and 22 is removed by washing it with water, for example. The unreacted shrink material 24 has water solubility. The shrink film 26 generated by the reaction is exposed on the upper surface of the photoresist film 22 and the inner surface of the opening 34. The opening 34 of the photoresist film 22 is shrunk by the shrink film 26 (the opening length is reduced). Since the photoresist film 20 and the shrink material 24 do not react with each other, the opening 32 of the photoresist film 20 hardly shrinks (the opening length is not reduced).

As a result, an opening length L2 of the opening 34 of a photoresist film 25 (i.e., the photoresist film 22 having the shrink film 26) is smaller than an opening length L3 of the opening 32 of the photoresist film 20. The opening length L2 is smaller than the opening length L1 of FIG. 1B by 0.1 μm to 0.5 μm, for example. The opening length L2 is 0.05 μm to 0.3 μm, for example.

A description will be given of the reason why the shrink material 24 does not react with the photoresist film 20 and reacts with the photoresist film 22. The shrink material 24 includes polyvinyl alcohol. The heat treatment in FIG. 1D causes a polymerization reaction between polyvinyl alcohols and/or a crosslinking reaction between the polyvinyl alcohol and the polymer resin (e.g. the novolac resin) in the photoresist. These reactions are accelerated by $H^+$ in the photoresist. Therefore, when the acidity of the photoresist film 22 is made larger than the acidity of the photoresist film 20, the photoresist film 22 and the shrink material 24 react with each other to form the shrink film 26. When the acidity of the photoresist film 20 is reduced, the reaction between the photoresist film 20 and the shrink material 24 is suppressed, and the shrink film is not formed in the opening 32 of the photoresist film 20.

The novolac resin in the photoresist films 20 and 22 is an extremely weak acid. However, since the acidity of the novolac resin is very small, the reaction between the shrink material 24 and the novolac resin is hardly accelerated. The naphthoquinone azide derivative in the photoresist films 20 and 22 transfers after photosensitization, binds with $H_2$, and changes to an indene carboxylic acid. However, since the acidity of the indene carboxylic acid is very small, the reaction between the shrink material 24 and the novolac resin is hardly accelerated.

From the above, it is considered that the organic solvent in the photoresist contributes to the acceleration of the reaction between the shrink material 24 and the photoresist. For example, ethyl lactate includes a hydroxyl group. The ethyl lactate has high acidity since $H^+$ is dissociated from the hydroxyl group. For example, 2-heptanone or 1,4-dioxane does not include the hydroxyl group, and has low acidity.

Therefore, the organic solvent of the photoresist film 22 includes a lot of ethyl lactate, and the organic solvent of the photoresist film 20 includes almost no ethyl lactate and almost no material for increasing acidity like ethyl lactate. This allows the shrink material 24 to react with the photoresist film 22 and hardly react with the photoresist film 20.

Experiment 1

To demonstrate the above effects, the following experiment was conducted. AZR200 manufactured by Merck was used as the shrink material 24. As the photoresist, PFI-89B8 manufactured by Sumitomo Chemical and THMRiP-3500 manufactured by Tokyo Ohka Kogyo were used.

The main components included in the AZR200 and their concentrations are as follows.
  Isopropyl alcohol: 5 wt. % to 10 wt. %
  Water: 85 wt. % or less
  Polyvinyl alcohol The main components included in the PFI-89B8 and their concentrations are as follows.
  Ethyl lactate: 34 wt. % to 36 wt. %
  2-heptanone: 34 wt. % to 36 wt. %
  1,4-dioxane: less than 1 wt. %
  Novolac resin: 22 wt. % to 26 wt. %
  Naphthoquinone azide derivative: 6 wt. %

The main components included in the THMRiP-3500 and their concentrations are as follows.
  2-heptanone: 45 wt. % to 95 wt. %
  1,4-dioxane: less than 1 wt. %
  Cresol: less than 1 wt. %
  Novolac resin
  Naphthoquinone azide derivative: 1 wt. % to 15 wt. %

Here, an undescribed concentration value of the component is considered to be less than or equal to a remaining amount (weight %) obtained from the total value of the weight % of the other components.

About half of the organic solvent of the PFI-89B8 is ethyl lactate. The organic solvent of the THMRiP-3500 does not include ethyl lactate and is mostly 2-heptanone and 1,4-dioxane. Therefore, it is considered that the PFI-89B8 reacts with the AZR200 to form the shrink film 26, but the THMRiP-3500 hardly reacts with the AZR200.

The reaction of each of the PFI-89B8 and the THMRiP-3500 with the AZR200 was examined. The following two samples were prepared.

Sample A: The THMRiP-3500 was applied on the semiconductor substrate so that the film thickness was about 0.3 μm, and the photoresist film was formed. The opening was formed in the photoresist film by exposing and developing the photoresist film using an i-line stepper. The opening length was 367 nm. After the shrink material was applied to the photoresist film, the whole semiconductor device was heat-treated at 110° C. for 70 seconds. The unreacted shrink material was removed by washing with water. The opening length of the opening in the photoresist film was 481 nm. An upper part of the photoresist film shrank and the opening length expanded by approximately 115 nm.

Sample B: The PFI-89B8 was applied on the semiconductor substrate so that the film thickness was about 0.3 μm, and the photoresist film was formed. The opening was formed in the photoresist film by exposing and developing the photoresist film using the i-line stepper. The opening length was 489 nm. After the shrink material was applied to the photoresist film, the whole semiconductor device was heat-treated at 110° C. for 70 seconds. The unreacted shrink material removed by washing with water. The opening length of the opening in the photoresist film was 351 nm. The opening length shrank by approximately 140 nm.

From the Experiment 1, it was confirmed that the THMRiP-3500 hardly reacted with the AZR200, whereas the PFI-89B89 reacted with the AZR200 and the opening length was reduced.

Experiment 2

Considering the results of the experiment 1, the opening was formed by using the AZR200 manufactured by Merck as the shrink material 24, the PFI-89B8 manufactured by Sumitomo Chemical as the photoresist film 22, and the THMRiP-3500 manufactured by Tokyo Ohka Kogyo as the photoresist film 20 according to a method described below, referring to FIGS. 1A to 1E.

In FIG. 1A, the THMRiP-3500 was applied on the semiconductor substrate 10 to form the photoresist film 20 having the thickness of about 0.3 μm on the semiconductor substrate 10. Furthermore, the PFI-89B8 was applied on the photoresist film 20 to form the photoresist film 22 having the thickness of about 0.3 In FIG. 1B, the ultraviolet ray having an exposure amount of 1650 J/cm$^2$ was exposed to the photoresist films 20 and 22 using the i-line stepper. The opening 30 having the opening length L1 of about 0.4 μm was formed in the photoresist films 20 and 22 by developing with an alkaline developer.

In FIG. 1C, the AZR200 is applied on the photoresist film 22 and inside the opening 30 using a spin coating method with a rotation speed of 1500 rpm to form the shrink material 24 (FIGS. 1A to 1E illustrate only a part of the cross section, but a semiconductor device in a wafer state is actually processed). As illustrated in FIG. 1D, the photoresist films 20 and 22 and the shrink material 24 were heat-treated (baked) at 100° C. Thereby, the photoresist film 22 and the shrink material 24 were reacted. As illustrated in FIG. 1E, the shrink material 24 that did not react (change) with the photoresist film 22 was removed by washing with water.

Figure 2:
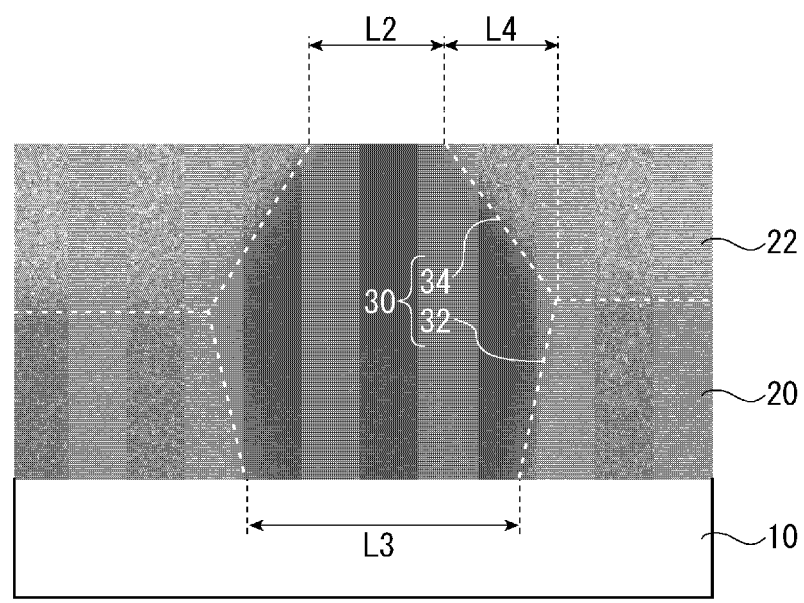
FIG. 2 is a view illustrating an SEM image of the opening formed in the photoresist films in an experiment 2.

The cross-section of the opening 30 was observed by a SEM (Scanning Electron Microscope). FIG. 2 illustrates an SEM image in a cross section cut along the film forming direction of the opening formed in the photoresist film in the Experiment 2. As illustrated in FIG. 2, the opening 32 formed in the photoresist film 20 has a forward tapered shape, and the opening length L3 on the lower surface of the opening 32 is about 0.4 The openings 32 and 34 at an interface between the photoresist films 20 and 22 are substantially the same. The opening 34 formed in the photoresist film 22 has the inverted tapered shape, the opening length L2 on the upper surface of the opening 34 is about 0.16 and a shrink amount L4 which is a difference between the lower surface and the upper surface of the opening 34 is about 0.12 μm on one side.

It is considered that the reason why the opening 34 has the inverted tapered shape is that mixing of organic solvents occurs near the interface between the photoresist films 20 and 22. For example, due to the mixing, the acidity of a part of the photoresist film 22 near the interface with the photoresist film 20 (i.e., a lower part of the inverted tapered shape) can be lower than the acidity of another part of the photoresist film 22 near a surface thereof (i.e., an upper part of the inverted tapered shape). The reason why the opening 32 has a slightly forward tapered shape is that the interface of the photoresist film 20 with the semiconductor substrate 10 is fixed in close contact with the semiconductor substrate 10, and the shape of the opening 32 (i.e., the opening length L1) in FIG. 1B is approximately maintained.

By making the opening length of the lower photoresist film wider than the opening length of the upper photoresist film as in the Patent Document 1, the electrode can be easily formed by lift-off. However, since light such as the ultraviolet ray is used to expose the photoresist films, the opening length of the upper photoresist film cannot be reduced. As in the Patent Document 2, the opening length can be reduced when the electron beam is used to expose the photoresist film. However, the throughput of electron beam drawing is extremely poor. Therefore, it is undesirable in terms of productivity and manufacturing cost.

As in the Patent Document 3, the use of the chemical solution that swells the photoresist film and light such as the i-line allows for high throughput, and allows the opening having a small opening length and the inverted tapered shape to be formed. In the third embodiment of the Patent Document 3, a film having a high affinity for the resist pattern swelling material and a film having a low affinity for the resist pattern swelling material are formed by the ashing treatment on the photoresist film or the temperature of the prebake. However, in such a method using the same photoresist films, the lower photoresist film also shrinks to some extent. Therefore, the opening is not an ideal opening for use in lift-off. Further, when the ashing treatment is performed, a layer under the opening (e.g. the semiconductor layer) is oxidized.

The Patent Document 3 describes that the shrink amount differs depending on a type of resin in the photoresist film as illustrated in FIG. 3. However, if the resin is different, the developer is also different. Therefore, a manufacturing method gets complicated in order to laminate the photoresist films having different resins. Accordingly, optimal manufacturing conditions may not be obtained. As described above, since the mechanism is insufficiently elucidated in the Patent Document 3, it is difficult to form the opening, in which the inverted tapered shape is located on the forward tapered shape, suitable for the lift-off method.

The inventors focused on $H^+$ in the photoresist films 20 and 22. As in the first embodiment, a photoresist having a higher acidity than the photoresist film 20 was selected as the photoresist film 22. As illustrated in FIG. 1A, the photoresist film 20 (i.e., a first photoresist film) is formed on the semiconductor substrate 10, and the photoresist film 22 (i.e., a second photoresist film) having a higher acidity than the photoresist film 20 is formed on the photoresist film 20. As illustrated in FIG. 1B, the opening 30 for exposing the surface of the semiconductor substrate 10 is formed by patterning the photoresist films 20 and 22. As illustrated in FIG. 1C, the shrink material 24 is applied to the upper surface of the photoresist film 22 and the inside of the opening 30. As illustrated in FIG. 1D, the shrink material 24 and the photoresist film 22 are reacted in the inside of the opening 34 of the photoresist film 22 by heat-treating the photoresist film 20, the photoresist film 22 and the shrink material 24. At this time, the photoresist film 20 hardly reacts with the shrink material 24. As illustrated in FIG. 1E, in order to expose the surface of the semiconductor substrate 10, the unreacted shrink material 24 is removed from the upper surface of the photoresist film 22 and the inside of the opening 30.

Thereby, as in the experiment 2, the opening length L2 in the photoresist film 22 reacted with the shrink material 24 is smaller than the opening length L3 in the photoresist film 20. That is, it is possible to form the opening 30 in which the opening length L2 on the upper surface of the opening 34 of the photoresist film 22 is smaller than the opening length L3 in the photoresist film 20. Therefore, the lift-off becomes easy. In this way, the photoresist films 20 and 22 having the shape of the opening 30 in which the cross section of the opening 34 has the inverted tapered shape can be formed. Further, the opening length L2 of the opening 34 on the surface of the photoresist film 22 is 0.16 and the opening length similar to the opening length by the electron beam drawing can be realized by using the i-line. This can improve the throughput. Since the opening 30 is formed without using the ashing treatment, the oxidation of the semiconductor substrate 10 under the opening 30 can be suppressed.

At the time of the heat treatment in FIG. 1D, it is important that the acidity of the photoresist film 22 is higher than that of the photoresist film 20. Therefore, the acidity of the organic solvent in the photoresist film 22 is made higher than that of the organic solvent in the photoresist film 20. That is, in the photoresist before coating in FIG. 1A, when the acidity of the organic solvent in the photoresist film 22 is higher than that of the organic solvent in the photoresist film 20, the acidity of the photoresist film 22 becomes higher than that of the photoresist film 20 at the time of the heat treatment.

The shrink material 24 includes polyvinyl alcohol, and the photoresist films 20 and 22 include the novolac resin. The photoresist films 20 and 22 further include ethyl lactate, and a weight concentration of ethyl lactate in the photoresist film 22 is higher than the weight concentration of ethyl lactate in the photoresist film 20. Thereby, the acidity of the organic solvent in the photoresist film 22 becomes higher than that of the organic solvent in the photoresist film 20.

In order to form the opening 30 in which an upper part of a cross-sectional shape has the inversed tapered shape and a lower part of the cross-sectional shape has the forward tapered shape, the weight concentration of ethyl lactate in the photoresist film 22 is preferably 5 times or more, more preferably 10 times or more, still more preferably 20 times or more than that of ethyl lactate in the photoresist film 20. The weight concentration of ethyl lactate in the photoresist film 22 is preferably 10 wt. % or more, more preferably 20 wt. % or more, still more preferably 30 wt. % or more. Since the photoresist film 22 includes the novolac resin, the weight concentration of ethyl lactate in the photoresist film 22 is preferably 80 wt. % or less. The weight concentration of ethyl lactate in the photoresist film 22 is preferably 5 wt. % or less, more preferably 1 wt. % or more.

The photoresist film 22 includes ethyl lactate, and the photoresist film 20 does not substantially include ethyl lactate. Thereby, the acidity of the organic solvent in the photoresist film 22 becomes higher than that of the organic solvent in the photoresist film 20. The weight concentration of ethyl lactate in the photoresist film 22 is preferably 10 wt. % or more, more preferably 20 wt. % or more, still more preferably 30 wt. % or more. The weight concentration of ethyl lactate in the photoresist film 22 is preferably 80 wt. % or less. The fact that the photoresist film 20 does not substantially include ethyl lactate means that the photoresist film 20 may include a small amount of ethyl lactate to the extent that the reaction with the shrink material 24 does not occur. For example, the weight concentration of ethyl lactate in the photoresist film 20 is 1 wt. % or less.

Second Embodiment

A second embodiment describes an example of a method for manufacturing a semiconductor device using the method for forming photoresist films having the opening in the first embodiment. FIGS. 3A to 3D and FIGS. 4A to 4C are cross-sectional views illustrating the method for manufacturing the semiconductor device according to the second embodiment. As illustrate in FIG. 3A, the semiconductor substrate 10 has a substrate 11 and a semiconductor layer 12 provided on the substrate 11. When the semiconductor device is the HEMT (High Mobility Electron Transistor), the substrate 11 is a SiC substrate, a silicon substrate, a GaN substrate, or a sapphire substrate, for example. The semiconductor layer 12 includes, for example, an AlN nucleation layer, a GaN layer, an AlGaN electron supply layer and a GaN cap layer from the substrate 11 side. The substrate 11 may be a GaAs substrate, and the semiconductor layer 12 may include a GaAs layer, an AlGaAs electron supply layer and a GaAs cap layer from the substrate 11 side.

Figure 3A:
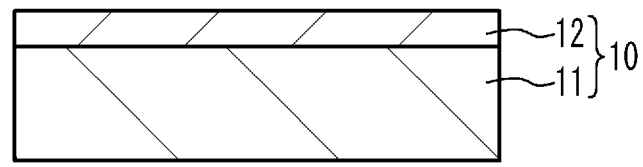
FIGS. 3A to 3D are cross-sectional views illustrating a method for manufacturing a semiconductor device according to a second embodiment (part 1).
Figure 3B:
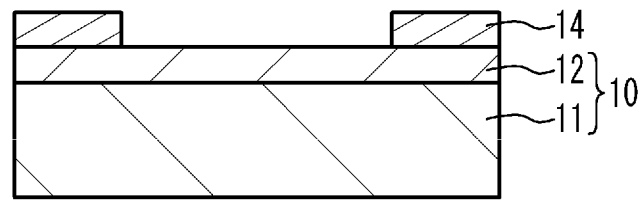

As illustrated in FIG. 3B, the ohmic electrode 14 is formed on the semiconductor substrate 10. The ohmic electrode 14 is a source electrode and a drain electrode, and includes a titanium film and an aluminum film from the semiconductor substrate 10 side, for example. For example, a vacuum deposition method and the lift-off method are used to form the ohmic electrode 14.

Figure 3C:
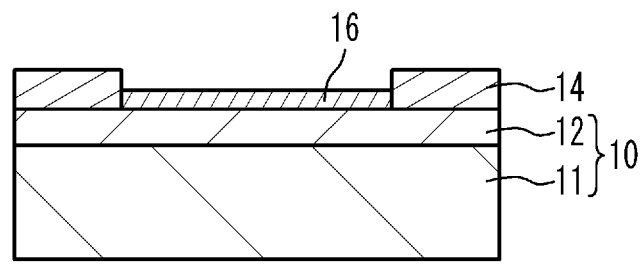
Figure 3D:
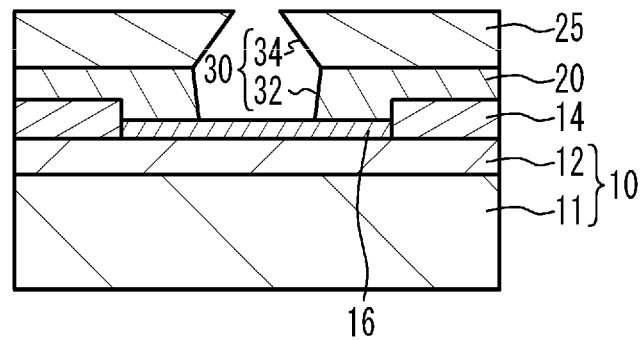

As illustrated in FIG. 3C, a protective film 16 is formed on the surface of the semiconductor substrate 10. The protective film 16 is an insulating film such as a silicon nitride film. For example, a CVD (Chemical Vapor Deposition) method is used to form the protective film 16. As illustrated in FIG. 3D, the method of the first embodiment is used to form the photoresist films 20 and 25 having the opening 30.

Figure 4A:
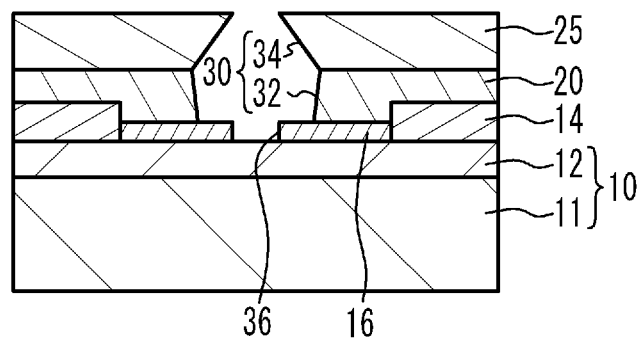
FIGS. 4A to 4C are cross-sectional views illustrating the method for manufacturing the semiconductor device according to the second embodiment (part 2).
Figure 4B:
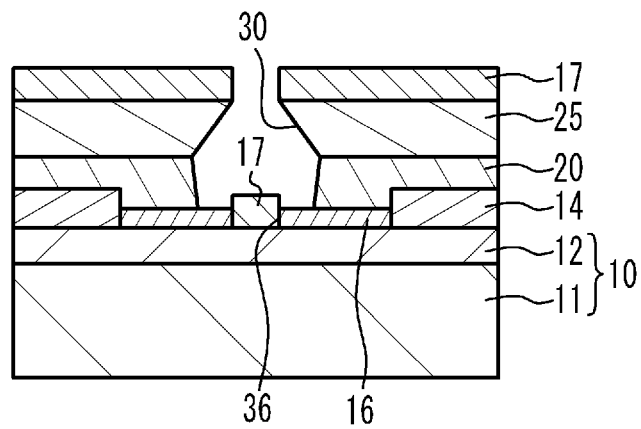

As illustrated in FIG. 4A, a part of the protective film 16 is removed by using the photoresist films 20 and 25 as a mask, and an opening 36 is formed in the protective film 16. For example, a dry etching method is used to remove the part of the protective film 16. Thereby, the upper surface of the semiconductor substrate 10 is exposed. As illustrated in FIG. 4B, a metal film 17 is formed in the opening 36 and on the photoresist film 25 by using the vacuum deposition method. The metal film 17 has a laminated structure including, for example, a nickel film, a palladium film, and a gold film from below.

Figure 4C:
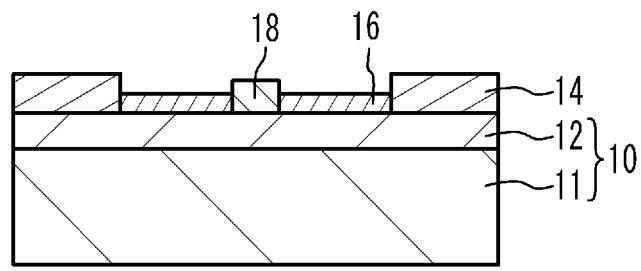

As illustrated in FIG. 4C, the metal film 17 on the photoresist film 25 is lifted off by removing the photoresist films 20 and 25. Thereby, a gate electrode 18 is formed on the semiconductor substrate 10 in the opening 36. In this way, the semiconductor device according to the second embodiment is completed.

In the second embodiment, the method of forming the photoresist films having the opening according to the first embodiment is used. Thereby, the opening 30 having the small opening length on the upper surface of the opening 30 can be formed without using the electron beam drawing. Therefore, the throughput can be improved. The opening length of the lower surface of the opening 30 is larger than that of the upper surface thereof. This makes it difficult for the metal film 17 to be formed on an inner circumferential surface of the opening 30 when the metal film 17 in FIG. 4B is formed. In particular, when the cross section of the photoresist film 20 has the forward tapered shape, the above-mentioned action is further enhanced. Thereby, in a lift-off step of FIG. 4C, the organic solvent can permeate the photoresist films 20 and 25 through the opening 30 and remove the photoresist films 20 and 25. In particular, since the photoresist film 20 has the forward tapered shape, the organic solvent easily permeates inside the opening 30. Also, burrs and the like are hard to be formed on the gate electrode 18. In this way, the opening 30 having a shape suitable for lift-off can be formed.

If the opening length of the upper surface of the opening 34 is smaller than the opening length of the opening 32, the opening 34 does not need to have the inverted tapered shape.

For example, an inner circumferential surface of the opening 34 may be perpendicular to the upper surface of the photoresist film 25. However, in order to avoid attaching the metal film 17 to the inner circumferential surface of the opening 34, the opening 34 preferably has the inverted tapered shape. The opening 32 does not need to have the forward tapered shape. For example, an inner circumferential surface of the opening 32 may be perpendicular to the lower surface of the photoresist film 20. The opening 32 preferably has the forward tapered shape so that the upper surface of the semiconductor substrate 10 is not exposed or the gate electrode 18 is not deposited on the protective film 16.

According to the second embodiment, after the unreacted shrink material 24 is removed, the metal film 17 is formed on the photoresist film 25 and in the opening 30 as illustrated in FIG. 4B. As illustrated in FIG. 4C, the gate electrode 18 made of the metal film 17 is formed on the semiconductor substrate 10 by removing the photoresist films 20 and 25. Thereby, the gate electrode 18 having a small gate length can be formed without using the electron beam drawing. The method of the first embodiment can also be used to form an electrode such as the ohmic electrode 14. Although the HEMT is exemplified as the semiconductor device, the semiconductor device may be a FET (Field Effect Transistor) other than the HEMT.

It is noted that the embodiments disclosed herein are merely illustrative in all aspects and should not be recognized as being restrictive. The scope of the present invention is defined by the scope of the claims, not in the above-mentioned meaning, and is intended to include meaning equivalent to the scope of the claims and all modifications within the scope.

What is claimed is:

1. A method for manufacturing a semiconductor device comprising steps of:

forming a first photoresist film on a semiconductor substrate, and forming a second photoresist film having a higher acidity than the first photoresist film on an upper surface of the first photoresist film;

forming a first opening for exposing a surface of the semiconductor substrate by patterning the first photoresist film and the second photoresist film;

applying shrink material to an upper surface of the second photoresist film and inside of the first opening, the shrink material touching a first side surface of the first photoresist film and a second side surface of the second photoresist film within the first opening;

heat-treating the first photoresist film, the second photoresist film and the shrink material simultaneously so as to form a shrink film on the second side surface of the second photoresist film and on the upper surface of the second photoresist film, with the shrink material having a greater reaction with the second side surface and the upper surface of the second photoresist film than with the first side surface of the first photoresist film, the second photoresist film having an upper portion and a lower portion, the lower portion being located between the upper portion and the first photoresist film and having an acidity lower than an acidity of the upper portion and higher than an acidity of the first photoresist film; and removing unreacted shrink material that does not react with the first photoresist film and the second photoresist film by washing with water so as to form a second opening in the shrink film from the first opening, and a third opening in the first photoresist film from the first opening, the second opening having an opening length on an upper surface of the second opening, the opening length being smaller than a minimum opening length in the third opening, and the second opening having a tapered shape in a cross-sectional view of the second photoresist film, wherein the shrink material includes polyvinyl alcohol, the first photoresist film and the second photoresist film include a novolac resin, the first photoresist film and the second photoresist film further include ethyl lactate, and a weight concentration of ethyl lactate in the second photoresist film is 5 times or more higher than that of ethyl lactate in the first photoresist film.

2. A method for manufacturing a semiconductor device comprising steps of:

forming a first photoresist film on a semiconductor substrate, and forming a second photoresist film having a higher acidity than the first photoresist film on an upper surface of the first photoresist film;

forming a first opening for exposing a surface of the semiconductor substrate by patterning the first photoresist film and the second photoresist film;

applying shrink material to an upper surface of the second photoresist film and inside of the first opening, the shrink material touching a first side surface of the first photoresist film and a second side surface of the second photoresist film within the first opening;

heat-treating the first photoresist film, the second photoresist film and the shrink material simultaneously so as to form a shrink film on the second side surface of the second photoresist film and on the upper surface of the second photoresist film, with the shrink material having a greater reaction with the second side surface and the upper surface of the second photoresist film than with the first side surface of the first photoresist film, the second photoresist film having an upper portion and a lower portion, the lower portion being located between the upper portion and the first photoresist film and having an acidity lower than an acidity of the upper portion and higher than an acidity of the first photoresist film; and removing unreacted shrink material that does not react with the first photoresist film and the second photoresist film by washing with water so as to form a second opening in the shrink film from the first opening, and a third opening in the first photoresist film from the first opening, the second opening having an opening length on an upper surface of the second opening, the opening length being smaller than a minimum opening length in the third opening, and the second opening having a tapered shape in a cross-sectional view of the second photoresist film, wherein the shrink material includes polyvinyl alcohol, the first photoresist film and the second photoresist film include a novolac resin, the second photoresist film further includes ethyl lactate, the first photoresist film includes no ethyl lactate, and a weight concentration of ethyl lactate in the second photoresist film is 10 wt. % or more.

3. The method for manufacturing the semiconductor device according to claim 1, wherein the opening length on the upper surface of the second opening is smaller than an opening length on an upper surface of the first opening.

4. The method for manufacturing the semiconductor device according to claim 1, wherein the shrink material does not react with the first photoresist film in the heat-treating.

5. The method for manufacturing the semiconductor device according to claim 1, wherein the third opening has a forward tapered shape, and the opening length of the lower surface of the second opening is equal to the opening length on the upper surface of the third opening.

6. The method for manufacturing the semiconductor device according to claim 1, wherein the third opening has a forward tapered shape.

7. The method for manufacturing the semiconductor device according to claim 1, wherein the weight concentration of ethyl lactate in the second photoresist film is 10 wt. % or more.

8. The method for manufacturing the semiconductor device according to claim 7, wherein the weight concentration of ethyl lactate in the second photoresist film is 80 wt. % or less.

9. The method for manufacturing the semiconductor device according to claim 8, wherein the weight concentration of ethyl lactate in the first photoresist film is 5 wt. % or less.

10. The method for manufacturing the semiconductor device according to claim 2, wherein the weight concentration of ethyl lactate in the second photoresist film is 80 wt. % or less.

11. The method for manufacturing the semiconductor device according to claim 2, wherein the opening length on the upper surface of the second opening is smaller than an opening length on an upper surface of the first opening.

12. The method for manufacturing the semiconductor device according to claim 2, wherein the shrink material does not react with the first photoresist film in the heat-treating.

13. The method for manufacturing the semiconductor device according to claim 3, wherein the third opening has a forward tapered shape, and the opening length of the lower surface of the second opening is equal to the opening length on the upper surface of the third opening.

14. The method for manufacturing the semiconductor device according to claim 2, wherein the third opening has a forward tapered shape.

* * * * *